(12) United States Patent
Agarwal et al.

(10) Patent No.: US 11,992,900 B2
(45) Date of Patent: May 28, 2024

(54) METHODS TO FABRICATE CHAMBER COMPONENT HOLES USING LASER DRILLING

(71) Applicant: Applied Materials, Inc., Santa Clara, CA (US)

(72) Inventors: Sumit Agarwal, Dublin, CA (US); Timothy Joseph Franklin, Campbell, CA (US)

(73) Assignee: APPLIED MATERIALS, INC., Santa Clara, CA (US)

( * ) Notice: Subject to any disclaimer, the term of this patent is extended or adjusted under 35 U.S.C. 154(b) by 753 days.

(21) Appl. No.: 17/090,770

(22) Filed: Nov. 5, 2020

(65) Prior Publication Data

US 2022/0111468 A1    Apr. 14, 2022

Related U.S. Application Data

(60) Provisional application No. 63/091,759, filed on Oct. 14, 2020.

(51) Int. Cl.
  *B23K 26/388*    (2014.01)
  *B23K 26/0622*   (2014.01)
  (Continued)

(52) U.S. Cl.
  CPC ......... *B23K 26/388* (2013.01); *H01L 21/306* (2013.01); *H01L 21/67207* (2013.01); *B23K 26/0624* (2015.10)

(58) Field of Classification Search
  CPC ........ H01J 37/32458; H01J 2237/0206; B23K 26/384; B23K 26/389; B23K 2103/05;
  (Continued)

(56) References Cited

U.S. PATENT DOCUMENTS

| 4,857,696 A | 8/1989 | Taeusch et al. |
| 7,479,304 B2 | 1/2009 | Sun et al. |

(Continued)

FOREIGN PATENT DOCUMENTS

| KR | 10-2020-0040433 A | 4/2020 |
| WO | WO2021154950 A1 | 8/2021 |

OTHER PUBLICATIONS

Zhang, Q., Wang, C., Liu, Y. et al. Picosecond laser machining of deep holes in silicon infiltrated silicon carbide ceramics. J. Wuhan Univ. Technol.-Mat. Sci. Edit. 30, 437-441 (2015). https://doi.org/10.1007/s11595-015-1167-9 (Year: 2015).*

(Continued)

*Primary Examiner* — John P. Dulka
(74) *Attorney, Agent, or Firm* — MOSER TABOA (57) ABSTRACT

Embodiments of a method of forming one or more holes in a substrate for use as a process chamber component are provided herein. In some embodiments, a method of forming one or more holes in a substrate for use as a process chamber component include forming the one or more holes in the substrate with one or more laser drills using at least one of a percussion drilling, a trepanning, or an ablation process, wherein each of the one or more holes have an aspect ratio of about 1:1 to about 50:1, and wherein the substrate is a component for gas delivery or fluid delivery.

15 Claims, 4 Drawing Sheets

(51) Int. Cl.
*H01L 21/306* (2006.01)
*H01L 21/67* (2006.01)

(58) Field of Classification Search
CPC ............ B23K 2103/10; B23K 2103/14; B23K 26/38; B23K 26/0624; C23C 16/4404; C23C 14/56; C23C 16/00; C23C 16/44
See application file for complete search history.

(56) References Cited

U.S. PATENT DOCUMENTS

| | | | |
|---|---|---|---|
| 7,887,712 B2 | 2/2011 | Boyle et al. | |
| 8,258,429 B2 | 9/2012 | Kobayashi et al. | |
| 2003/0102291 A1* | 6/2003 | Liu | B23K 26/073 219/121.75 |
| 2003/0188685 A1* | 10/2003 | Wang | C23C 16/4404 204/298.11 |
| 2003/0193117 A1* | 10/2003 | Schreiner | H05K 3/0038 264/400 |
| 2004/0245226 A1 | 12/2004 | Callies et al. | |
| 2012/0168412 A1 | 7/2012 | Hooper | |
| 2012/0267350 A1* | 10/2012 | Howerton | B23K 26/384 219/121.71 |
| 2016/0279895 A1* | 9/2016 | Marjanovic | B32B 17/06 |
| 2022/0314371 A1* | 10/2022 | Luisi | B05B 1/14 |

OTHER PUBLICATIONS

PCT International Search Report and Written Opinion for PCT/US2021/055012 dated Feb. 4, 2022.

\* cited by examiner

METHODS TO FABRICATE CHAMBER COMPONENT HOLES USING LASER DRILLING

CROSS-REFERENCE TO RELATED APPLICATIONS

This application claims benefit of U.S. provisional patent application Ser. No. 63/091,759, filed Oct. 14, 2020 which is herein incorporated by reference in its entirety.

FIELD

Embodiments of the present disclosure generally relate to substrate processing equipment.

BACKGROUND

Deposition and etch chambers (process chambers) are typically used in the manufacturing of semiconductor devices. Some substrates disposed within these process chambers include holes. For example, a gas distribution plate for use in a process chamber may include holes with high aspect ratios to distribute one or more process fluids within the process chamber. Holes with high aspect ratios reduce or prevent plasma backflow. Traditional methods of fabricating these holes utilize a mechanical method such as ultrasonic impact grinding or mechanical drilling. However, these methods have to be done slowly to avoid damage and meet tolerance requirements, and therefore, are expensive.

Accordingly, the inventors have provided improved methods and apparatus for forming holes through a substrate for use as process chamber components.

SUMMARY

Embodiments of a method of forming one or more holes in a substrate for use as a process chamber component are provided herein. In some embodiments, a method of forming one or more holes in a substrate for use as a process chamber component include forming the one or more holes in the substrate with one or more laser drills using at least one of a percussion drilling, a trepanning, or an ablation process, wherein each of the one or more holes have an aspect ratio of about 1:1 to about 50:1, and wherein the substrate is a component for gas delivery or fluid delivery.

In some embodiments, a method of forming one or more holes in a substrate for use in a process chamber, includes: placing the substrate on a substrate support, wherein the substrate is a gas distribution plate comprising silicon; and forming the one or more holes in the substrate with one or more laser drills using at least one of a percussion drilling, a trepanning, or an ablation process.

In some embodiments, an apparatus for forming holes in a substrate for use in a process chamber, including: a substrate support having one or more retaining surfaces for holding the substrate and a central opening to expose a bottom surface of the substrate, wherein the substrate support is configured to at least one of translate along an elongate axis of the substrate or rotate about a central axis of the substrate support; and one or more laser drills disposed at least one of above or below the substrate support, wherein the one or more laser drills are configured to direct photon energy towards the substrate with a pulse duration of about 1.0 nanosecond or less and with a pulse energy of about 1.0 to about 8.0 millijoules.

Other and further embodiments of the present disclosure are described below.

BRIEF DESCRIPTION OF THE DRAWINGS

Embodiments of the present disclosure, briefly summarized above and discussed in greater detail below, can be understood by reference to the illustrative embodiments of the disclosure depicted in the appended drawings. However, the appended drawings illustrate only typical embodiments of the disclosure and are therefore not to be considered limiting of scope, for the disclosure may admit to other equally effective embodiments.

To facilitate understanding, identical reference numerals have been used, where possible, to designate identical elements that are common to the figures. The figures are not drawn to scale and may be simplified for clarity. Elements and features of one embodiment may be beneficially incorporated in other embodiments without further recitation.

DETAILED DESCRIPTION

Embodiments of methods and apparatus of forming one or more holes in a substrate for use as a process chamber component are provided herein. The substrate may a component for gas or fluid delivery, for example, a gas distribution plate, a showerhead, an upper electrode, a cooling plate, or any other suitable process chamber component having one or more holes therethrough. In some embodiments, the substrate may be a component for use in a plasma process chamber, for example, a dielectric etch process chamber. In some embodiments, the substrate may be a component for use in a deposition chamber. The methods and apparatus provided herein advantageously employ laser drilling to provide improved precision of holes (tolerance for hole diameter and true precision), and improved consistency from hole to hole and part to part. The methods and apparatus provided herein may also advantageously provide improved hole quality with reduced sub-surface damage which also results in elimination of other processing steps used in traditional methods, such as, for example, chemical etching and a polishing step.

Figure 1:
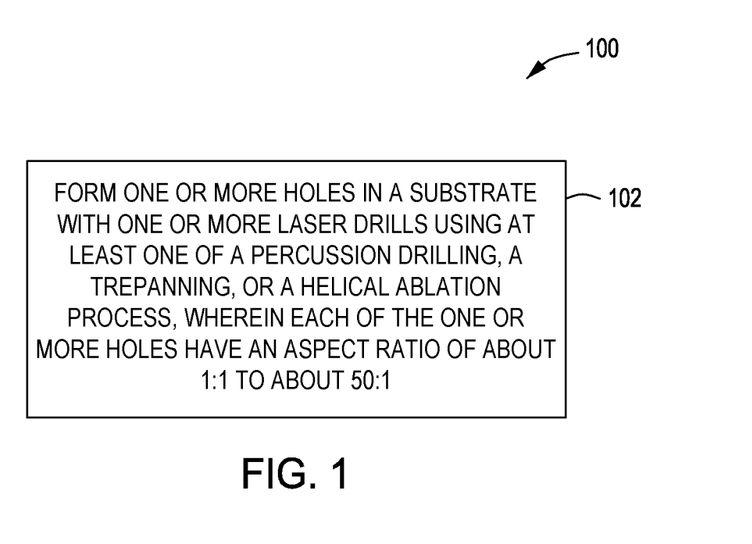
FIG. 1 depicts a flowchart of a method of forming holes in a substrate for use in a process chamber in accordance with some embodiments of the present disclosure.

FIG. 1 depicts a flowchart of a method 100 of forming holes in a substrate for use in a process chamber in accordance with some embodiments of the present disclosure. In some embodiments, the method 100 may be performed by using the hole forming apparatus 200 of FIG. 2A-2B. At 102, one or more holes are formed in a substrate (e.g., substrate 208) for use in a process chamber with one or more laser drills (e.g., one or more laser drills 215) using at least one of a percussion drilling, a trepanning, or an ablation process, wherein each of the one or more holes (e.g., one or more holes 214) have an aspect ratio of about 1:1 to about 50:1. In some embodiments, each of the one or more holes have an aspect ratio of about 10:1 to about 50:1. In some embodiments, each of the one or more holes have an aspect ratio of about 25:1 to about 50:1.

In some embodiments, the substrate is made of silicon, silicon carbide, aluminum, nickel, molybdenum, or a ceramic material. The substrate may be a gas distribution plate, a showerhead, an upper electrode, or any other suitable substrate for use in a process chamber having one or more holes therethrough. In some embodiments, the substrate has a thickness of about 0.70 mm to about 20.0 mm. In some embodiments, the substrate has a thickness of about 5.0 mm to about 20.0 mm. In some embodiments, the substrate has a thickness of about 0.70 mm to about 10.0 mm. In such embodiments, the one or more holes may be formed via single-side drilling from a first side (e.g., first side 250) of the substrate to a second side (e.g., second side 260) of the substrate. In some embodiments, the substrate has a thickness of about 10.0 mm to about 20.0 mm. In such embodiments, the one or more holes may be formed via double-side drilling from both the first side of the substrate to the second side of the substrate. In some embodiments, the substrate 208 has a substantially uniform thickness. In some embodiments, the substrate 208 may have a thickness that varies (see FIG. 4).

In some embodiments, a purge gas is advantageously directed to the one or more holes while drilling the one or more holes to purge out ablated material. The purge gas helps minimize re-deposition and helps to control a shape and dimension of the one or more holes. The purge gas may be directed to the one or more holes simultaneously while drilling the one or more holes. The purge gas may be introduced around a laser beam of the one or more laser drills and be directed directly to the one or more holes. The purge gas may be any suitable gas, for example an inert gas such as nitrogen gas or argon gas.

Figure 2A:
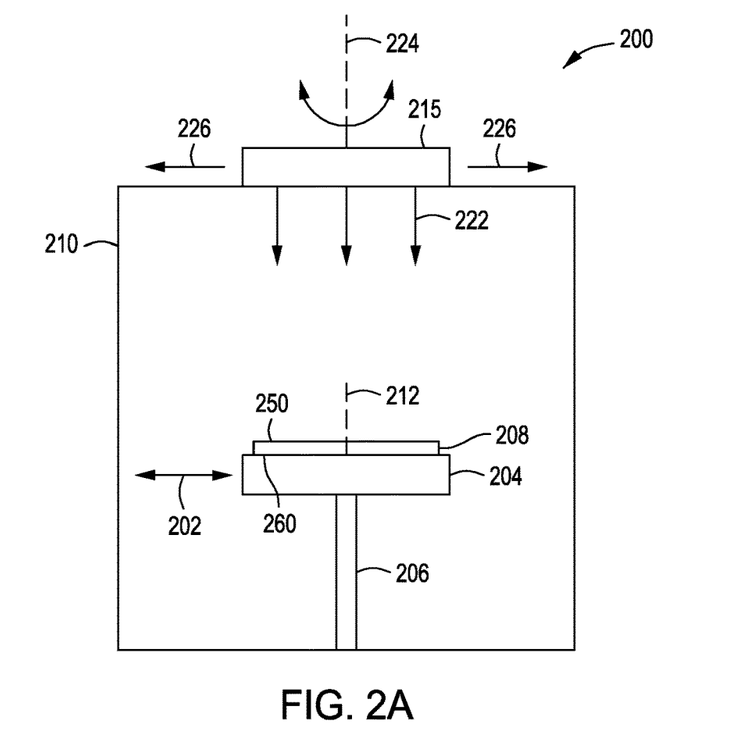
FIG. 2A depicts a schematic side view of a single-side hole forming apparatus in accordance with some embodiments of the present disclosure.
Figure 2B:
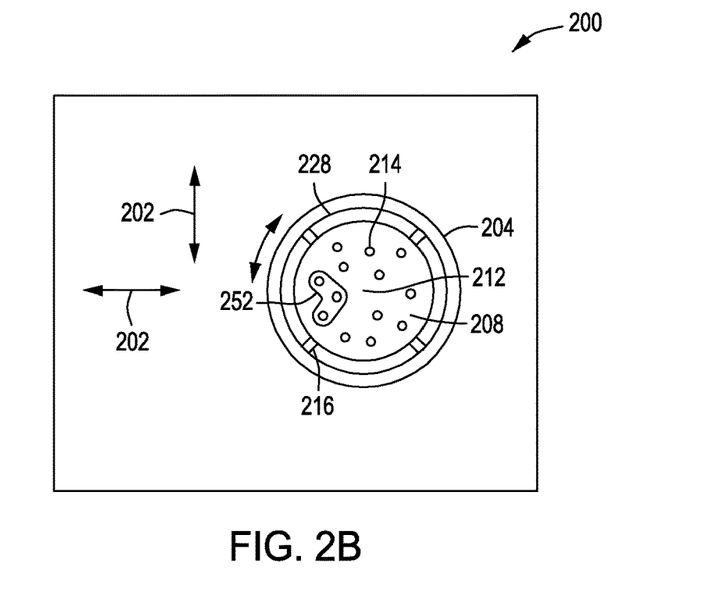
FIG. 2B depicts a schematic top view of a single-side hole forming apparatus in accordance with some embodiments of the present disclosure.

FIG. 2A depicts a schematic side view and FIG. 2B is a schematic top view of a top view of a single-side hole forming apparatus 200 for performing 102 in accordance with some embodiments of the present disclosure. The hole forming apparatus 200 includes a substrate 208 disposed on a substrate support 204. In some embodiments, the substrate support 204 may rotate about a central axis 212 to rotate the substrate 208. In some embodiments, the substrate support 204 is configured to move in a lateral direction 202 along an elongate axis orthogonal to the central axis 212 to move the substrate 208. The substrate support 204 may be supported by one or more legs 206. In some embodiments, the one or more legs 206 comprises two legs that are rotatably coupled to the substrate support 204 on either side of the substrate support 204. The substrate support 204 may move in the lateral direction 202 with respect to the one or more legs 206.

The substrate 208 includes a second side 260 facing the substrate support 204 and a first side 250 opposite the second side 260. The substrate support 204 includes one or more retaining surfaces for holding the substrate 208 and a central opening 228 to expose the second side 260, or bottom surface, of the substrate 208. In some embodiments, the one or more retaining surfaces is an annular ledge that extends into the central opening 228. In some embodiments, as shown in FIG. 2B, the one or more retaining surfaces include a plurality of mounting tabs 216 extending into the central opening 228.

One or more laser drills 215 are disposed above the substrate support 204. In some embodiments, the hole forming apparatus 200 includes an enclosure 210, where the substrate support 204 is disposed within the enclosure 210. In some embodiments, at least one of the one or more laser drills 215 are coupled to a top wall of the enclosure 210.

In some embodiments, the one or more laser drills 215 are configured to move in a lateral direction 226 (e.g., up/down/left/right) with respect to the substrate support 204. In some embodiments, the one or more laser drills 215 are configured to rotate with respect to the substrate 208 about a central axis 224 of the one or more laser drills 215. In some embodiments, the central axis 224 of the one or more laser drills 215 is parallel to the central axis 212 of the substrate 208. In some embodiments, the one or more laser drills 215 are configured to tilt along an axis orthogonal to the central axis 224 to perform off-axis drilling of the substrate 208 (see FIG. 3C).

The one or more laser drills 215 are configured to direct photon energy 222 to remove material from the substrate 208 to form one or more holes 214. In some embodiments, the one or more holes 214 are arranged in a suitable pattern for gas delivery or fluid delivery. For example, the one or more holes 214 may be one hole disposed at a central region of the substrate 208, a plurality of holes disposed at regular intervals along one or more circles, disposed in a rectilinear grid, disposed in a pattern having a greater concentration of holes in a peripheral region as compared to a central region, or any other suitable pattern. While FIG. 2B depicts the one or more holes 214 having a circular cross-sectional shape, the one or more holes 214 may have an oval, rectangular, or other cross-sectional shape.

In some embodiments, the one or more holes 214 include a plurality of sets of holes, where each set of the plurality of sets of holes include one or more holes that make up the one or more holes 214. For example, the one or more holes 214 includes a first set 252 of one or more holes (set of three holes shown in FIG. 2B). In some embodiments, each laser drill of the one or more laser drills 215 comprises a single laser head to form a single hole. In some embodiments, each laser drill of the one or more laser drills 215 comprises a plurality of laser heads to form multiple holes (e.g., the first set 252) simultaneously.

For single-side drilling, the one or more laser drills 215 face the first side 250 of the substrate 208. For two-sided drilling, in some embodiments, the one or more laser drills 215 face the first side 250 and the substrate 208 is then rotated so that the one or more laser drills 215 face the second side 260 of the substrate 208. In some embodiments, for two-sided drilling, the one or more laser drills 215 are disposed on either side of the substrate support 204 so that the one or more laser drills 215 face the first side 250 and the second side 260 of the substrate 208. Such a configuration is described in U.S. patent application Ser. No. 16/945,461, filed Jul. 31, 2020 and titled "METHOD OF FORMING HOLES FROM BOTH SIDES OF SUBSTRATE".

Figure 5:
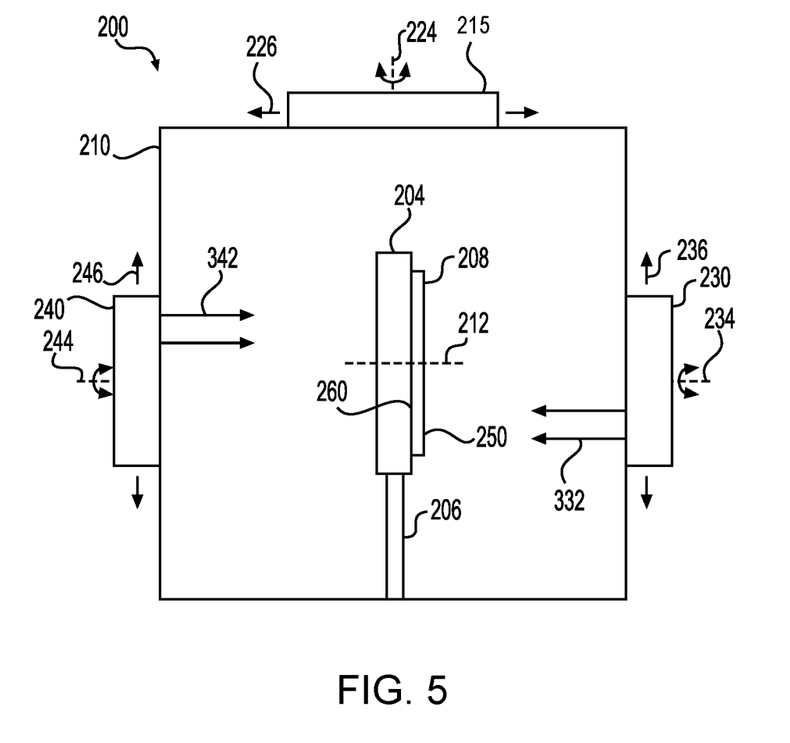
FIG. 5 depicts a schematic side view of a two-side hole forming apparatus in accordance with some embodiments of the present disclosure.

FIG. 5 depicts a schematic side view of a two-side hole forming apparatus in accordance with some embodiments of the present disclosure. In some embodiments, a second drill 230 and a third drill 240 are disposed on opposite sides of the substrate support 204. In a two-side drilling position, as shown in FIG. 5, the second drill 230 faces the first side 250 of the substrate 208 and the third drill 240 faces the second side 260 of the substrate 208. In some embodiments, the second drill 230 faces the second side 260 and the third drill 240 faces the first side 250. In such embodiments, the second drill 230 and the third drill 240 are used to drill first partial holes from the first side 250 of the substrate 208 to a first location disposed between the first side 250 and the second side 260 of the substrate 208 and to drill second partial holes from the second side 260 of the substrate 208 to the first location (described in more detail below in FIGS. 3B-3C). In some embodiments, the second drill 230 and the third drill 240 both form roughly half of each hole of the one or more holes 214 to advantageously reduce the work and precision required from each of the second drill 230 and the third drill 240.

In some embodiments, the second drill 230 is configured to move in a lateral direction 236 (e.g., up/down/left/right) with respect to substrate support 204. In some embodiments, the third drill 240 is configured to move in a lateral direction 246 (e.g., up/down/left/right) with respect to substrate support 204. In some embodiments, the second drill 230 is configured to rotate with respect to the substrate 208 along a central axis 234 of the second drill 230. In some embodiments, the third drill 240 is configured to rotate with respect to the substrate 208 along a central axis 244 of the third drill 240. The first drill 220, the second drill 230, and the third drill 240 may be disposed inside or outside the enclosure 210.

In some embodiments, the central axis 234 of the second drill 230 is parallel to the central axis 212 of the substrate 208 when the substrate 208 is in a two-side drilling position. In some embodiments, the central axis 244 of the third drill 240 is parallel to the central axis 212 of the substrate 208 when the substrate 208 is in a two-side drilling position. In some embodiments, the second drill 230 and the third drill 240 are laser drills configured to direct photon energy 332 and photon energy 342, respectively, to remove material from the substrate 208 to form the one or more holes 214. In some embodiments, the second drill 230 has a plurality of laser heads to at least partially form multiple holes of the one or more holes 214 simultaneously. In some embodiments, the third drill 240 has a plurality of laser heads to at least partially form multiple holes of the one or more holes 214 simultaneously.

Figure 6:
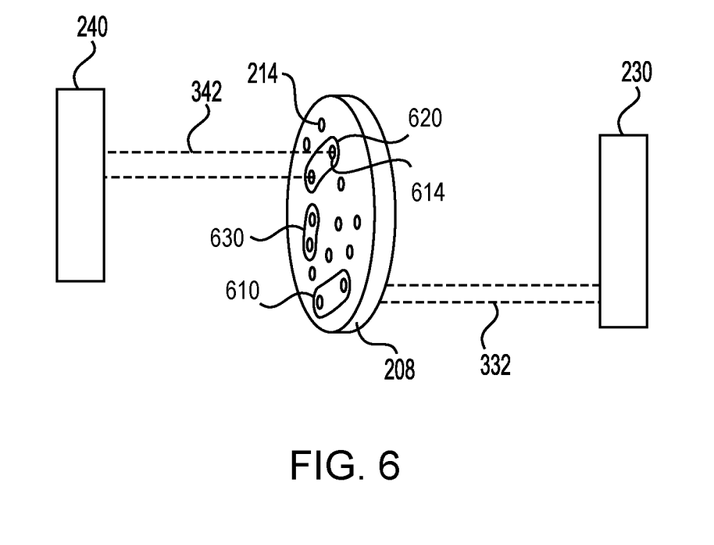
FIG. 6 depicts a schematic partial isometric view of a two-side hole forming apparatus in accordance with some embodiments of the present disclosure.

FIG. 6 depicts a schematic partial isometric view of a two-side hole forming apparatus in accordance with some embodiments of the present disclosure. The substrate support 204 is not shown in FIG. 6 to aid in visibility. In some embodiments, the one or more holes 214 include a plurality of sets of holes. In some embodiments, the plurality of sets of holes of the one or more holes 214 includes a first set 610, a second set 620, and a third set 630. In some embodiments, the second drill 230 is configured to drill the first set 610 of the plurality of sets of holes and then finishes another set of the plurality of sets of holes and continues repetitively until all of the one or more holes 214 are partially drilled from the first side 250 of the substrate 208. In some embodiments, the third drill 240 is configured to drill the second set 620 of the plurality of sets of holes and then finishes another set of the plurality of sets of holes and continues repetitively until all of the one or more holes 214 are partially drilled from the second side 260 of the substrate 208.

The second drill 230 and the third drill 240 are each configured to at least partially form all of the one or more holes 214 so that together, the second drill 230 and the third drill 240 form the one or more holes 614. In some embodiments, as shown in FIG. 6, the second drill 230 is configured to at least partially drill the first set 610 of the one or more holes 214 simultaneously while the third drill 240 is configured to at least partially drill the second set 620 of the one or more holes 214. In some embodiments, the second drill 230 and the third drill 240 do not simultaneously form the same hole of the one or more holes 214.

In some embodiments, the substrate 208 rotates about the central axis 212 after drilling a set of the plurality of sets of holes using at least one of the second drill 230 and the third drill 240. In some embodiments, at least one of the second drill 230 or the third drill 240 moves (e.g., rotationally or laterally with respect to the substrate 208) between drilling of each set of the plurality of sets of holes. In some embodiments, the second drill 230 and the third drill 240 may move in a combination of lateral and rotation directions between each set of the plurality of sets of holes.

Each of the first set 610, the second set 620, and the third set 630 may include two or more holes of the one or more holes 214 (sets of two holes shown in FIG. 6). In some embodiments, the second drill 230 is configured to at least partially drill each hole of the first set 610 simultaneously. In some embodiments, the third drill 240 is configured to at least partially drill each hole of the second set 620 simultaneously. In some embodiments, the second drill 230 is configured to at least partially drill each hole of the first set 610 simultaneously with the third drill 240 at least partially drilling each hole of the second set 620. One or more of the substrate 208, the second drill 230, or the third drill 240 may be moved to at least partially form the third set 630.

Referring back to FIG. 1, in some embodiments, forming the one or more holes comprises forming one or more rough holes having a first size through the substrate. In some embodiments, the one or more rough holes may be formed via the percussion drilling process using the one or more laser drills or a mechanical drilling process. The percussion drilling process generally comprises repeatedly pulsing the one or more laser drills with a pulse energy for a pulse duration. With each pulse, a photon beam is directed at the substrate to remove material. In some embodiments, the one or more laser drills direct a photon beam over a first set of one or more rough holes to be formed. In some embodiments, for single-side drilling, the pulses are repeated until the first set of one or more rough holes are formed through the substrate. The mechanical drilling process may generally comprises using a rotary tool to form the one or more rough holes.

In some embodiments, at least one of the one or more laser drills or the substrate are moved (e.g. along lateral direction 202 or lateral direction 226) so that the one or more laser drills may direct a photon beam over a second set of one or more rough holes to be formed. The aforementioned process continues until all of the one or more rough holes are formed. In some embodiments, the percussion drilling process comprises a pulse duration of about 1.0 nanosecond or less. In some embodiments, the percussion drilling process is performed with a pulse energy of about 1.0 to about 8.0 millijoules. In some embodiments, the one or more holes are drilled at a speed of about 0.1 mm per second or faster, for example, to about 0.8 mm per second. The one or more holes are drilled faster via laser drilling as compared to conventional methods, advantageously providing a cost improvement.

In some embodiments, forming the one or more holes comprises using the one or more laser drills to finish the one or more rough holes via at least one of an ablation or trepanning process. An ablation process generally comprises removing material from a solid surface by irradiating the surface with photon energy. The ablation process may comprise a helical ablation process, where material is removed along a helical path. A trepanning process generally comprises moving a laser head in various geometries to remove material, for example, a circular geometry at various radii to remove material. In other examples, the trepanning process may comprise moving the laser head in a non-circular geometry, such as, an oval, a rectangular, or an amorphous geometry to remove material. As such, the ablation or trepanning process increases a diameter or cross-sectional area of the one or more rough holes from the first size to a larger second size while providing improved hole quality with reduced sub-surface damage.

Finishing via the ablation or trepanning process may comprise at least one of reducing a roughness of the one or more rough holes, increasing a roundness of the one or more rough holes, increasing a diameter or cross-sectional area of the one or more rough holes, or making the one or more rough holes more uniform in diameter or cross-sectional area with respect to each other (i.e., improved consistency from hole to hole). In some embodiments, a concentricity of the finished one or more holes is up to about 25% more concentric than a concentricity of the one or more rough holes. In some embodiments, a roundness of the one or more rough holes is about 25% greater than a roundness of the finished one or more holes. In some embodiments, a diameter of the finished one or more holes is up to about 50% larger than a diameter of the one or more rough holes. In some embodiments, the trepanning process or the ablation process comprises a pulse duration of about 1.0 nanosecond or less. In some embodiments, the trepanning process or the ablation process is performed with a pulse energy of about 1.0 to about 8.0 millijoules. In some embodiments, same ones of the one or more laser drills may be used to perform the percussion drilling and ablation or trepanning processes. In some embodiments, different ones of the one or more laser drills may be used to perform the percussion drilling and ablation or trepanning processes.

In some embodiments, where the substrate has a thickness of about 10.0 mm to about 20.0 mm, the one or more holes may be formed via double-side drilling from both sides (e.g., first side 250 and second side 260) of the substrate. In such embodiments, the one or more laser drills are disposed on either side of the substrate and are used to drill first partial holes (e.g., first partial holes 310) from a first side of the substrate to a first location (e.g., first location 308) disposed between the first side and a second side of the substrate and to drill second partial holes (e.g., second partial holes 320) from the second side of the substrate to the first location. In some embodiments, the first partial holes and the second partial holes are formed via an ablation process. In some embodiments, the first partial holes are formed via a percussion drilling process to form rough first partial holes, followed with an ablation process to finish (as described above) the rough first partial holes. In some embodiments, the second partial holes are formed via a percussion drilling process to form rough second partial holes, followed with an ablation process to finish (as described above) the rough second partial holes. In some embodiments, the first partial holes are drilled to a larger diameter than the second partial holes to provide tolerance so that the second partial holes may meet with the first partial holes.

Figure 3A:
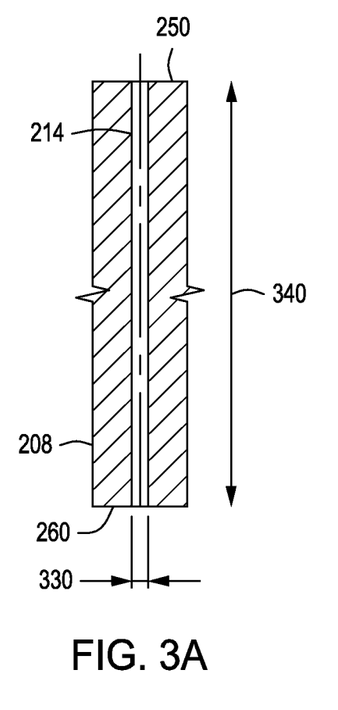
FIG. 3A depicts a cross-sectional view of a portion of a substrate in accordance with some embodiments of the present disclosure.
Figure 3B:
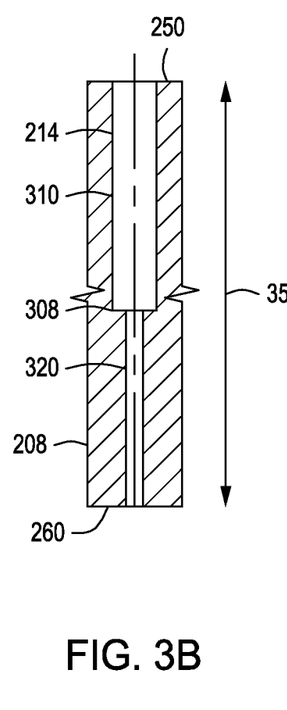
FIG. 3B depicts a cross-sectional view of a portion of a substrate in accordance with some embodiments of the present disclosure.

FIG. 3A depicts a cross-sectional view of a portion of a substrate in accordance with some embodiments of the present disclosure. FIG. 3A depicts a hole of the one or more holes 214 after the ablation or trepanning process. In some embodiments, each hole of the one or more holes 214 has a substantially constant diameter. In some embodiments, the one or more holes 214 taper inward, outward, or both inward and outward from the first side 250 to the second side 260 (i.e., having a diameter or cross-sectional area that varies along a length of the hole). In some embodiments, a thickness 340 of the substrate 208 is about 0.70 mm to about 10.0 mm. In some embodiments, a diameter 330 of the one or more holes 214 is about 75.0 micrometers to about 750.0 micrometers.

FIG. 3B depicts a cross-sectional view of a portion of a substrate in accordance with some embodiments of the present disclosure. FIG. 3B depicts a hole of the one or more holes 214 formed via two-sided drilling after the ablation or trepanning process. In some embodiments, the one or more holes 214 include first partial holes 310 extending from the first side 250 of the substrate 208 to a first location 308 disposed between the first side 250 and the second side 260. In some embodiments, the one or more holes 214 include second partial holes 320 extending from the second side 260 to the first location 308 to intersect with the first partial holes 310. In some embodiments, the second partial holes 320 have a diameter or cross-sectional area greater than the first partial holes 310. In some embodiments, a thickness 350 of the substrate 208 is greater than about 10.0 mm.

Figure 3C:
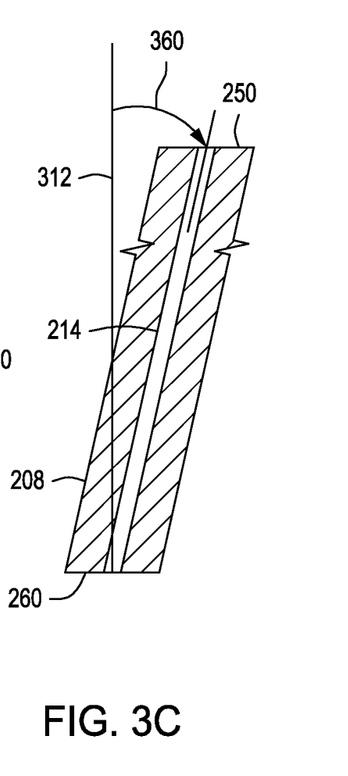
FIG. 3C depicts a cross-sectional view of a portion of a substrate in accordance with some embodiments of the present disclosure.

FIG. 3C depicts a cross-sectional view of a portion of a substrate in accordance with some embodiments of the present disclosure. In some embodiments, the one or more holes 214 extend at an angle of incidence 360 with respect to a vertical axis 312 of the substrate 208. In some embodiments, the vertical axis 312 is parallel to the central axis 212. In some embodiments, the angle of incidence 360 is between about zero degrees to about ninety degrees. In some embodiments, the angle of incidence 360 is between about zero degrees to about sixty degrees. The one or more holes 214 may extend at the angle of incidence 360 to direct gas flow in a desired manner. At least one laser head of the one or more laser drills 215 may be rotated or tilted to direct a photon beam at the angle of incidence 360 to form the one or more holes 214 that extend at the angle of incidence 360 through the substrate 208.

Figure 4:
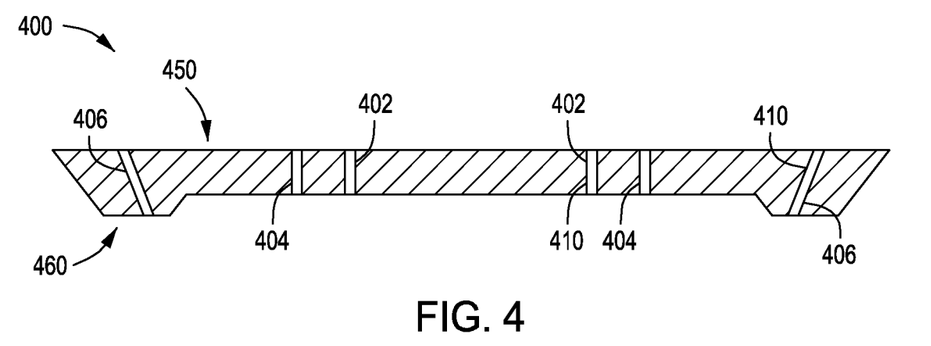
FIG. 4 depicts a cross-sectional view of a substrate in accordance with some embodiments of the present disclosure.

FIG. 4 depicts a cross-sectional view of a substrate 400 in accordance with some embodiments of the present disclosure. The substrate 400 may be a gas delivery plate for use in a process chamber, for example, a dielectric etch chamber. In some embodiments, the substrate 400 is the substrate 208. The substrate 400 includes a first side 450 and a second side 460 opposite the first side 450. The substrate 400 includes one or more holes 410 extending from the first side 450 to the second side 460. The one or more holes 410 may be the one or more holes 214. In some embodiments, the one or more holes 402 may be arranged along one or more concentric rings. For example, the substrate 400 may include a first set of holes 402 of the one or more holes 410 along arranged along a first ring. The substrate 400 may include a second set of holes 404 of the one or more holes 410 arranged along a second ring disposed radially outward of the first ring. In some embodiments, the second ring is concentric with the first ring. In some embodiments, the substrate 400 may include a third set of holes 406 of the or more holes 410 arranged along a third ring disposed radially outward of the first ring and the second ring.

The first set of holes 402 may extend through the substrate 400 substantially vertically downward (as depicted in FIG. 4) or may extend off-axis, for example, radially inward and downward or radially outward and downward. The second set of holes 404 may extend through the substrate 400 substantially vertically downward (as depicted in FIG. 4) or may extend off-axis, for example, radially inward and downward or radially outward and downward. The third set of holes 406 may extend through the substrate 400 substantially vertically downward or may extend off-axis, for example, radially inward and downward (as depicted in FIG. 4) or radially outward and downward.

While the foregoing is directed to embodiments of the present disclosure, other and further embodiments of the disclosure may be devised without departing from the basic scope thereof.

The invention claimed is:

1. A method of forming one or more holes in a substrate for use as a process chamber component comprising:
    forming the one or more holes in the substrate with one or more laser drills using at least one of a percussion drilling process, a trepanning process, or an ablation process, wherein each of the one or more holes have an aspect ratio of about 1:1 to about 50:1, and wherein the substrate is a component for gas delivery or fluid delivery, wherein the percussion drilling process or the ablation process comprises a pulse duration of about 1.0 nanosecond or less, further comprising:
    (1) wherein the substrate has a thickness of about 0.70 mm to about 10.0 mm, wherein the one or more holes are formed from a first side of the substrate to a second side of the substrate, and wherein forming the one or more holes comprises:
        forming one or more rough holes through the substrate via the percussion drilling process using the one or more laser drills or a mechanical drilling process; and
        using the one or more laser drills to finish the one or more rough holes to form the one or more holes via at least one of the ablation or the trepanning process, wherein finishing the one or more rough holes comprises at least one of reducing a roughness of the one or more rough holes, increasing a roundness of the one or more rough holes, increasing a diameter of the one or more rough holes, or making the one or more rough holes more uniform in diameter with respect to each other, or
    (2) wherein the substrate has a thickness of about 10.0 mm to about 20.0 mm, and wherein forming the one or more holes comprises:
        using the one or more laser drills to drill first partial holes via an ablation process from a first side of the substrate to a first location disposed between the first side and a second side of the substrate; and
        using the one or more laser drills to drill second partial holes via an ablation process from the second side of the substrate to the first location.

2. The method of claim 1, wherein the percussion drilling process or the ablation process comprises a pulse energy of about 1.0 to about 8.0 millijoules.

3. The method of claim 1, wherein at least one of:
    a diameter of the first partial holes is greater than a diameter of the second partial holes, or
    a diameter of the one or more holes is about 75.0 micrometers to about 750.0 micrometers.

4. The method of claim 1, further comprising directing a purge gas to the one or more holes while forming the one or more holes.

5. The method of claim 1, wherein the substrate is made of silicon, silicon carbide, aluminum, nickel, molybdenum, or a ceramic material.

6. The method of claim 1, wherein the one or more holes are drilled at a speed of about 0.1 mm per second or faster.

7. The method of claim 1, wherein the one or more holes extend at an angle of incidence relative to a vertical axis of the substrate between about zero degrees to about ninety degrees.

8. A method of forming one or more holes in a substrate for use in a process chamber, comprising:
    placing the substrate on a substrate support, wherein the substrate is a gas distribution plate comprising silicon; and
    forming the one or more holes in the substrate with one or more laser drills using at least one of a percussion drilling process, a trepanning process, or an ablation process, wherein the percussion drilling process or the ablation process comprises a pulse duration of about 1.0 nanosecond or less, and wherein forming the one or more holes, comprises:
    (1) using the one or more laser drills to drill first partial holes via an ablation process from a first side of the substrate to a first location disposed between the first side and a second side of the substrate, and using the one or more laser drills to drill second partial holes via an ablation process from the second side of the substrate to the first location, or
    (2) forming one or more rough holes through the substrate via the percussion drilling process using the one or more laser drills or a mechanical drilling process, and using the one or more laser drills to finish the one or more rough holes via at least one of an ablation process or trepanning process.

9. The method of claim 8, wherein the first partial holes are drilled to a larger diameter than the second partial holes.

10. An apparatus for forming holes in a substrate for use in a process chamber, comprising:
    a substrate support having one or more retaining surfaces for holding the substrate and a central opening to expose a bottom surface of the substrate, wherein the substrate support is configured to at least one of translate along an elongate axis of the substrate or rotate about a central axis of the substrate support; and
    one or more laser drills disposed at least one of above or below the substrate support, wherein the one or more laser drills are configured to direct photon energy towards the substrate with a pulse duration of about 1.0 nanosecond or less and with a pulse energy of about 1.0 to about 8.0 millijoules.

11. The apparatus of claim 10, wherein the one or more laser drills are disposed above and below the substrate support.

12. The apparatus of claim 10, wherein the substrate support is configured to rotate about an elongate axis of the substrate support orthogonal to the central axis.

13. The apparatus of claim 10, wherein the one or more laser drills are configured to at least one of move in a lateral direction or rotate with respect to the substrate support.

14. The apparatus of claim 10, wherein the one or more laser drills comprise two laser drills disposed on opposite sides of the substrate support.

15. The apparatus of claim 10, wherein the substrate support is configured to rotate about the elongate axis.

* * * * *